(12) United States Patent
Noble et al.

(10) Patent No.: US 6,256,225 B1
(45) Date of Patent: *Jul. 3, 2001

(54) CONSTRUCTION AND APPLICATION FOR NON-VOLATILE REPROGRAMMABLE SWITCHES

(75) Inventors: Wendell P. Noble, Milton, VT (US); Eugene H. Cloud, Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/261,479

(22) Filed: Feb. 26, 1999

(51) Int. Cl.[7] .................................................. G11C 16/04
(52) U.S. Cl. ................ 365/185.05; 365/149; 365/185.14
(58) Field of Search ........................ 365/185.05, 185.14, 365/185.26, 185.28, 185.33, 149; 257/301, 303

(56) References Cited

U.S. PATENT DOCUMENTS

| | | | |
|---|---|---|---|
| 4,051,354 | 9/1977 | Choate | 235/312 |
| 4,761,768 | 8/1988 | Turner et al. | 365/201 |
| 4,766,569 | 8/1988 | Turner et al. | 365/185 |
| 5,196,722 | 3/1993 | Bergendahl et al. | 257/304 |
| 5,247,346 | 9/1993 | Hazani | 257/314 |
| 5,250,857 | 10/1993 | Miyazaki | 307/449 |
| 5,324,681 | 6/1994 | Lowrey et al. | 437/52 |
| 5,327,380 | 7/1994 | Kersh, III et al. | 365/195 |
| 5,331,188 | 7/1994 | Acovic et al. | 257/298 |
| 5,347,490 | 9/1994 | Terada et al. | 365/219 |
| 5,416,735 | 5/1995 | Onishi et al. | 365/145 |

(List continued on next page.)

OTHER PUBLICATIONS

Abbas, S.A., et al., "N–Channel IGFET Design Limitations due to Hot Electron Trapping", *Technical Digest*, International Electron Devices Meeting, Washington, D.C., 35–38, (Dec. 1–3, 1975).

(List continued on next page.)

*Primary Examiner*—David Nelms
*Assistant Examiner*—David Lam
(74) *Attorney, Agent, or Firm*—Schwegman, Lundberg, Woessner & Kluth, P.A.

(57) ABSTRACT

The present invention includes a DRAM technology compatible non-volatile, reprogrammable switch formed according to an DRAM optimized process flow. The non-volatile, reprogrammable switch includes a non-volatile memory cell. The non-volatile memory cell includes a first metal oxide semiconductor field effect transistor (MOSFET) formed in a semiconductor substrate. A capacitor is formed in a subsequent layer above the first MOSFET and is separated from the MOSFET by an insulator layer. A vertical electrical via couples a bottom plate of the capacitor through the insulator layer to a gate of first MOSFET. A second MOSFET is formed in the semiconductor substrate. The gate of the first MOSFET also serves as a gate of the second MOSFET. Additional MOSFETs can be combined in a similar fashion with the non-volatile cell to create a new, powerful logic cell that is smaller and more robust than conventional circuit solutions.

The present invention includes applications such as a very size efficient address decode tree, data routing device, or other applications such as used in DRAM redundancy schemes. Methods for forming and using the present invention are also included. The need for intervening sense amps normally required to read the status of a non-volatile memory cell (e.g. an EEPROM cell) and communicate this to additional logic that would then in turn control the status of one or more switches is eliminated. Thus, the requirements of low power densely packed integrated circuits is realized for smaller, portable microprocessor devices.

57 Claims, 8 Drawing Sheets

U.S. PATENT DOCUMENTS

| | | | |
|---|---|---|---|
| 5,598,367 | 1/1997 | Noble | 365/149 |
| 5,621,233 | 4/1997 | Sharma et al. | 257/316 |
| 5,748,530 | 5/1998 | Gotou et al. | 365/185.18 |
| 5,763,913 | 6/1998 | Jeong | 257/316 |
| 5,764,096 | 6/1998 | Lipp et al. | 327/434 |
| 5,886,379 | 3/1999 | Jeong | 257/319 |
| 5,912,840 * | 6/1999 | Gonzalez et al. | 365/185.05 |
| 5,981,335 | 11/1999 | Chi | 438/253 |

OTHER PUBLICATIONS

Bude, J.D., et al., "Secondary Electron Flash—a High Performance, Low Power Flash Technology for 0.35 micrometer and Below", International Electron Devices Meeting, *Technical Digest*, Held in Washngton, D.C., 279–282, (Dec. 7–10, 1997).

Choi, J.D., et al., "A Triple Polysilicon Stacked Flash Memory Cell with Wordline Self–Boosting Programming", International Electron Devices Meeting, *Technical Digest*, Held in Washington, D.C., 283–286, (Dec. 7–10, 1997).

Chung, S.S., et al., "Performance and Reliability Evaluations of P–Channel Flash Memories with Different Programming Schemes", International Electron Devices Meeting, *Technical Digest*; Held in Washington, D.C., 295–298, (Dec. 7–10, 1997).

Crowder, S., et al., "Trade–offs in the Integration of High Performance Devices with Trench Capacitor DRAM", Dig. Int. Electron Devices Meeting, Washington, D.C., 45–48, (Dec. 1997).

Forbes, L., et al., "Field Induced Reemission of Electrons Trapped in SiO(2)", *IEEE Transactions on Electron Devices*, ED–26 (11), Briefs, 1816–1818, (Nov. 1979).

Hodges, D.A., et al., "Analysis and Design of Digitial Integrated Circuits", McGraw–Hill Book Company, 2nd Edition, 394–396, (1988).

Hwang, N., et al., "Tunneling and Thermal Emission of Electrons from a Distribution of Deep Traps in SiO2", *IEEE Transactions on Electron Devices*, 40 (6), 1100–1103, (Jun. 1993).

Ishiuchi, H., et al., "Embedded DRAM Technologies", *IEDM Technical Digest*, 33–36, (1997).

Kang, H.K., et al., "Highly Manufacturable Process Technology for Reliable 256 Mbit and 1 Gbit DRAMs", *IEEE*, 635–638, (1994).

Kato, M., et al., "A Shallow–Trench–Isolation Flash Memory Technology with a Source–Bias Programming Method", International Electron Devices Meeting, *Technical Digest*, Held in San Francisco, CA, 177–180, (Dec. 8–11, 1996).

Kobayashi, T., et al., "A 0.24–micrometer Cell Process with 0.18–micrometer Width Isolation and 3–D Interpoly Dielectric Films for 1–Gb Flash Memories", International Electron Devices Meeting, *Technical Digest*, Held in Washington, D.C., 275–278, (Dec. 7–10, 1997).

Oashi, T., et al., "16Mb DRAM/SOI Technologies for Sub–IV Operation"International Electron Devices Meeting, *Technical Digest*, Held in San Francisco, CA, 609–612, (Dec. 8–11, 1996).

Shen, S., et al., "Novel Self–Convergent Programming Scheme for Multi–Level P–Channel Flash Memory", International Electron Devices Meeting, *Technical Digest*, Held in Washington, D.C., 287–290, (Dec. 7–10, 1997).

Shimizu, K., et al., "A Novel High–Density 5F NAND STI Cell Technology Suitable for 256Mbit and 1Gbit Flash Memories", *IEEE*, 271–274, (1997).

Sunouchi, K., et al., "240nm Pitch 4GDRAM Array MOSFET Technologies with X–ray Lithography,", International Electron Devices Meeting, *Technical Digest*, Held in San Francisco, CA, 601–604, (Dec. 8–11, 1996).

Togo, M., et al., "A Salicide–Bridged Trench Capacitor with a Double–Sacrificial–Si N –Sidewall (DSS) for High–Performance Logic–Embedded DRAMS", International Electron Devices Meeting, *Technical Digest*, 37–40, (1997).

* cited by examiner

CONSTRUCTION AND APPLICATION FOR NON-VOLATILE REPROGRAMMABLE SWITCHES

RELATED APPLICATIONS

This application is related to the co-filed and commonly assigned applications, U.S. patent application Ser. No. 09/261,597, filed on Feb. 26, 1999, entitled "Applications for Non-Volatile Memory Cells," by Eugene H. Cloud and Wendell P. Noble, U.S. patent application Ser. No. 09/261,598, filed on Feb. 26, 1999, entitled "DRAM Technology Compatible Processor/Memory Chips," by Leonard Forbes, Eugene H. Cloud, and Wendell P. Noble, and U.S. patent application Ser. No. 09/259,493, filed on Feb. 26, 1999, entitled "DRAM Technology Compatible Non-Volatile Memory Cells," by Wendell P. Noble and Eugene H. Cloud which are hereby incorporated by reference and filed on even day herewith.

FIELD OF THE INVENTION

The present invention relates generally to semiconductor integrated circuits and, more particularly, to the construction and application for non-volatile, reprogrammable switches.

BACKGROUND OF THE INVENTION

Programmable switches are used in a variety of ways in modern day integrated circuits. One example of the implementation of programmable switches includes their use in field programmable gate arrays (FPGAs). Typically, a field programmable gate array (FPGA) has an array of logic elements and wiring interconnections with thousands, or even tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

Generally an antifuse, such as described in U.S. Pat. No. 5,324,681, which issued to Lowrey et al. on Jun. 28, 1994, is used as a programmable interconnect for the wiring and circuit elements of a FPGA. The antifuse integrally combines the functions of a switching element which makes the interconnection and a programming element which stores the state of the switching element, either "off" or "on." Thus an antifuse occupies little space on the integrated circuit, but has the disadvantage of not being reprogrammable. This single-time programmability makes the antifuse difficult to test and unsuitable for a large class of applications where reprogrammability is required.

Alternative programmable interconnects use a metal oxide semiconductor field programmable transistor (MOSFET) as the switching element. The MOSFET is controlled by the stored memory bit of a programming element. Most commonly, this programming element is a dynamic random access memory (DRAM) cell. Such DRAM based FPGAs are reprogrammable, but the programming of the switching elements is lost whenever power is turned off. A separate, non-volatile memory cell must be used to store the programmed pattern on power down, and the FPGA must be reprogrammed each time the device is powered back up.

With the increasing array density of successive generations of DRAM chips, the attractiveness of merging non-volatile memory functions onto the DRAM chip has increased. However, any successful merged technology product must be cost competitive with the existing alternative of combining separate chips at the card or package level, each being produced with independently optimized technologies. Any significant addition of process steps to an existing DRAM technology in order to combine such functions becomes rapidly cost prohibitive due to the added process complexity cost and decreased yield.

Device size and required programming voltages pose additional problems to merging non-volatile memory cells with DRAM memory cells. An example of a non-volatile memory cell is a MOSFET with a floating gate which may be charged and discharged. Charging and discharging the floating gate provides for the non-volatile programmability. A control gate forms a capacitive cell with the floating gate to retain charge on the floating gate in a "programmed" state. The plates of the capacitive cell must be fabricated with a large enough surface area to provide a capacitive coupling ratio which is sufficient to retain charge and is able to withstand the effects of parasitic capacitances vis a vis other circuit components. The shrinking device size in the increased cell density array found on DRAM chips necessitates increasing programming voltages in order to retain the required capacitance levels unless the size of the capacitive cell can be maintained. Increasing the programming voltage, however, increases the power dissipation and future generations of non-volatile memory cell devices will require lower power dissipation.

Modem DRAM technologies are driven by market forces and technology limitations to converge upon a high degree of commonality in basic cell structure. For the DRAM technology generations from 4 Mbit through1 Gbit, the cell technology has converged into two basic structural alternatives; trench capacitor and stacked capacitor. A method for utilizing a trench DRAM capacitor technology to provide a compatible EEPROM cell has been described in U.S. Pat. No. 5,598,367. A different approach is needed for stacked capacitors however.

Another problem for the application of non-volatile memory cells in FPGAs relates to the ability of these cells to drive the MOSFET switching elements. Existing non-volatile memory cells do not have a sufficiently high voltage output. Sense amplifiers must be used to convert the small output signal from a non-volatile memory cell to a full voltage digital signal which is then used to load the DRAM cell.

One approach to solving this problem is described in U.S. Pat. No. 5,764,096, which issued to Lipp et al. on Jun. 9, 1998. U.S. Pat. No. 5,764,096 provides a general purpose non-volatile, reprogrammable switch, but does not achieve the same using the commonality in basic DRAM cell structure. Thus, the Lipp patent does not achieve the desired result of providing non-volatile memory functions on a DRAM chip with little or no modification of the DRAM optimized process flow.

Thus, there is a need for novel DRAM technology compatible non-volatile, reprogrammable switches for use in FPGAs and other applications. It is desirable that such DRAM technology compatible non-volatile, reprogrammable switches be fabricated on a DRAM chip with little or no modification of the DRAM optimized process flow. It is further desirable that such DRAM technology compatible non-volatile, reprogrammable switches operate with lower programming voltages than that used by conventional EEPROM cells, yet still hold sufficient charge to withstand the effects of parasitic capacitances and noise due to circuit operation.

SUMMARY OF THE INVENTION

The above mentioned problems for producing DRAM technology compatible non-volatile, reprogrammable switches for use in FPGAs and other applications as well as other problems are addressed by the present invention and will be understood by reading and studying the following specification. The present invention includes a DRAM technology compatible non-volatile, reprogrammable switch formed according to a DRAM optimized process flow.

In one embodiment, a non-volatile, reprogrammable switch is provided. The non-volatile reprogrammable switch includes a non-volatile memory cell. The non-volatile memory cell includes a first metal oxide semiconductor field effect transistor (MOSFET) formed in a semiconductor substrate. A capacitor is formed in a subsequent layer above the first MOSFET and is separated from the MOSFET by an insulator layer. A vertical electrical via couples a bottom plate of the capacitor through the insulator layer to a gate of first MOSFET. A second MOSFET is formed in the semiconductor substrate. The gate of the first MOSFET also serves as a gate of the second MOSFET.

In another embodiment, a non-volatile, reprogrammable switch is provided. The non-volatile reprogrammable switch includes a non-volatile memory cell. The non-volatile memory cell includes a first metal oxide semiconductor field effect transistor (MOSFET) formed in a semiconductor substrate. A stacked capacitor is formed in a subsequent layer above the first MOSFET and is separated from the MOSFET by an insulator layer. A vertical electrical via couples a bottom plate of the capacitor through the insulator layer to a gate of first MOSFET. A second MOSFET is formed in the semiconductor substrate. The gate of the first MOSFET also serves as a gate of the second MOSFET. A third MOSFET is formed in the semiconductor substrate. The gate of the first and second MOSFET also serves as a gate of the third MOSFET.

In another embodiment, a data routing device is provided. The data routing device includes a number of non-volatile, reprogrammable switches. Each non-volatile, reprogrammable switch includes a non-volatile memory cell. Each non-volatile memory cell includes a first metal oxide semiconductor field effect transistor (MOSFET) formed in a semiconductor substrate. A capacitor is formed in a subsequent layer above the first MOSFET and is separated from the MOSFET by an insulator layer. A vertical electrical via couples a bottom plate of the capacitor through the insulator layer to a gate of first MOSFET. A second MOSFET is formed in the semiconductor substrate. The gate of the first MOSFET also serves as a gate of the second MOSFET. A number of programming control lines are coupled to the non-volatile memory cells in the number of non-volatile, reprogrammable switches. A number of input bit lines are coupled to an input node for the second MOSFET in the number of non-volatile, reprogrammable switches. A number of output bit lines are coupled to an output node for the second MOSFET in the number of non-volatile, reprogrammable switches.

In another embodiment, a method for forming a non-volatile, reprogrammable switch is provided. The method includes forming a non-volatile memory cell. Forming the non-volatile memory cell includes forming a first metal oxide semiconductor field effect transistor (MOSFET) in a semiconductor substrate. Forming the non-volatile memory cell includes forming a capacitor and forming a vertical electrical via such that the vertical electrical via couples a bottom plate of the capacitor through an insulator layer to a gate of first MOSFET. The method further includes forming a second MOSFET in the semiconductor substrate. According to the method, forming the first MOSFET includes forming the gate of the first MOSFET as a gate for of the second MOSFET.

In another embodiment, a method for operating a switching element is provided. The method includes sharing a gate between a non-volatile memory cell and a first, and a second, MOSFET. The gate is a floating gate for the non-volatile memory cell. The method includes programming the non-volatile memory cell in either a first or a second programmed state. And, the method includes reading a current conducted through the first MOSFET.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1A:
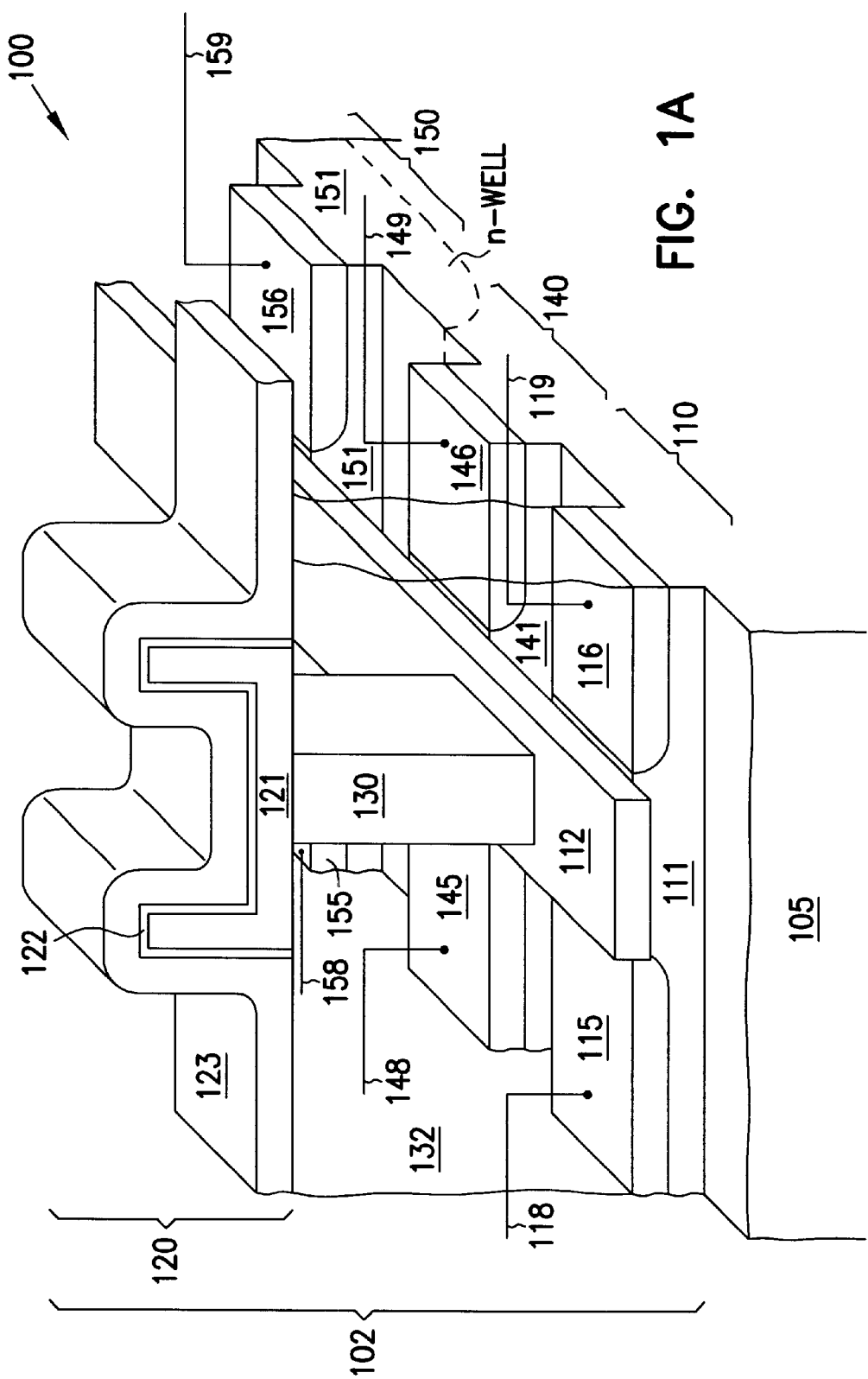
FIG. 1A is a perspective view, illustrating one embodiment of a non-volatile, reprogrammable switch according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1A is a perspective view, illustrating one embodiment of a non-volatile, reprogrammable switch 100 according to the teachings of the present invention. As shown in FIG. 1A, the non-volatile, reprogrammable switch 100 includes a first, a second, and a third metal oxide semiconducting field effect transistor (MOSFET), shown respectively as 110, 140, and 150 formed on a substrate 111 on a dynamic random access memory (DRAM) chip 105. All of the MOSFETs share a common gate 112. In the embodiment shown in FIG. 1, the first MOSFET 110 and the second MOSFET 140 are n-channel metal oxide semiconducting (NMOS) transistors. MOSFET 150 are shown as a p-channel metal oxide semiconducting (PMOS) transistor formed in an n-well 151 in the substrate 111.

Figure 1B:
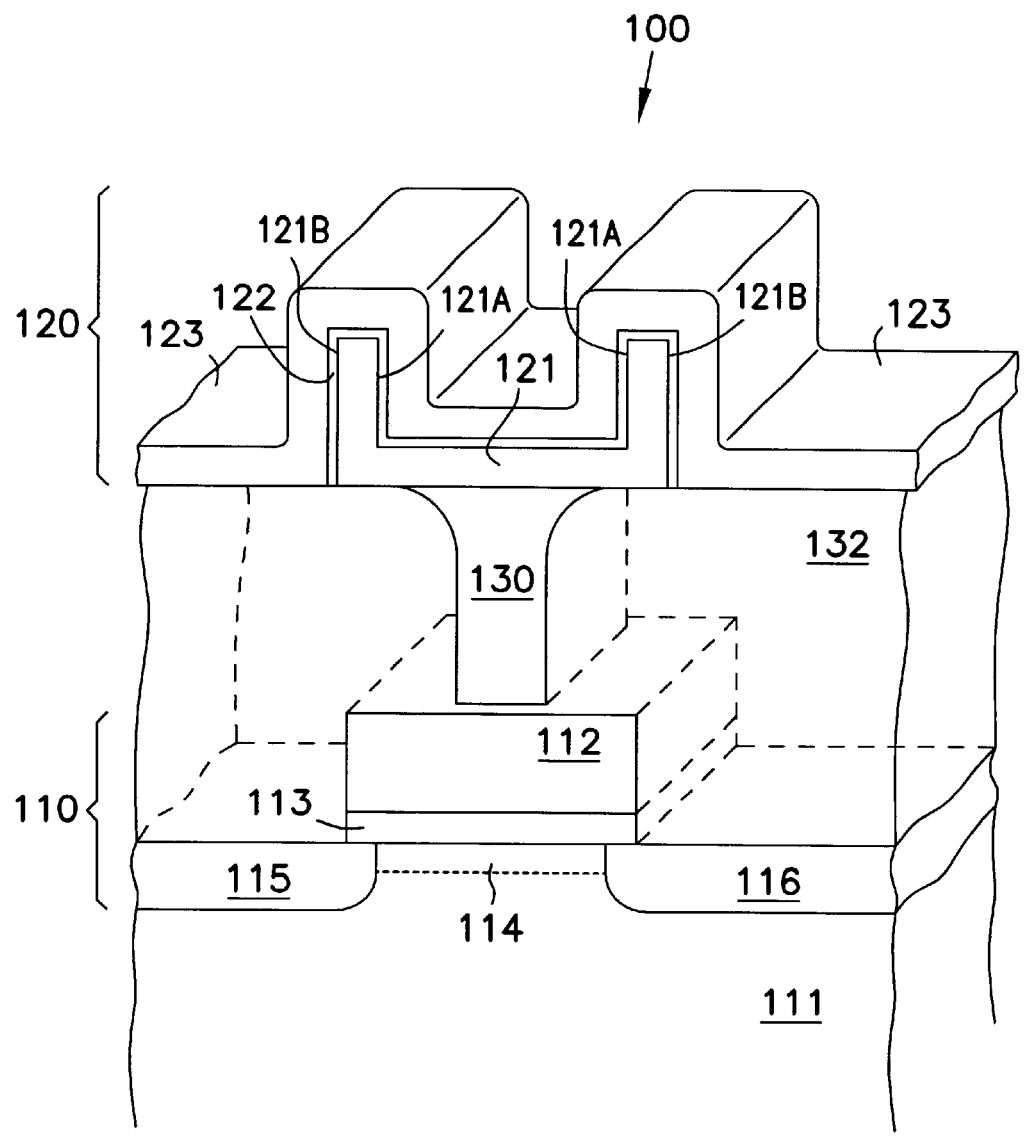
FIG. 1B illustrates, in isolation, a non-volatile memory cell portion of the non-volatile, reprogrammable switch presented in FIG. 1A.

In an alternative embodiment the doping and polarity of the MOSFETS is reversed. Also, in an alternative embodiment, a third MOSFET 150 is not included in the non-volatile, reprogrammable switch 100. The non-volatile, reprogrammable switch 100 includes a capacitor 120 fabricated using conventional DRAM process steps. A bottom plate 121 of the capacitor 120 is coupled to the gate 112 by a vertical electrical via 130, or electrical contact 130. Together the first MOSFET 110, the capacitor 120, and the electrical contact 130 comprise a non-volatile memory cell 102. The non-volatile memory cell 102 is shown in isolation in FIG. 1B. As shown in FIG. 1B, the capacitor 120 is separated from the first MOSFET 110 by an insulator layer 132. The electrical contact 130 couples the bottom plate 121 of the capacitor 120 to the gate 112 through the insulator layer 132. In FIG. 1B, gate 112 is shown separated from a channel region 114 of the first MOSFET 110 by a gate oxide 113.

In one embodiment, gate oxide 113 has a thickness of less than 100 Angstroms (Å). Although not shown, the gate 112 is similarly separated by a gate oxide from a channel region for the second and third MOSFETs, 140 and 150. Insulator layer 132 is omitted from FIG. 1A for clarity. The non-volatile memory cell 102 includes all the embodiments of the non-volatile memory cell structure presented and described in detail in the co-filed application Ser. No. 09/259,493, filed Feb. 26, 1999, entitled "DRAM Technology Compatible Non-volatile Memory Cells," by Wendell P. Noble and Eugene H. Cloud, which is hereby incorporated by reference in its entirety for purposes of enablement.

In FIG. 1A, a number of programming control lines, 118, 119, and 123, are coupled to the non-volatile memory cell 102. A first control line 118 is coupled to a first diffused region 1 of the first MOSFET 110. A second control line 119 is coupled to the second diffused region 116 of the first MOSFET 110. A third control line 123 is formed as a top plate 123 for the capacitor 120. In the embodiment shown in FIG. 1A, the capacitor includes a stacked capacitor 120 formed according to a DRAM process flow. As shown in FIG. 1B, the stacked capacitor 120 includes a bottom plate 121 which is cup shaped having interior walls 121A and exterior walls 121B. The bottom plate 121 is separated by a capacitor dielectric 122 from the top plate 123. The capacitor dielectric 122 is conformal to the bottom plate 121 and the top plate 123 is conformal to the capacitor dielectric 122. In the embodiments of FIGS. 1A and 1B, a portion of the top plate 123 is located within the interior walls 121A of the bottom plate 121. Also, a portion of the top plate 123 is located outside of the exterior walls 121B of the bottom plate 121.

The non-volatile memory cell 102 serves as a programming element 102 for the non-volatile, reprogrammable switch 100. The top plate 123 serves as a control gate 123 for the programming element 102. The bottom plate 121 serves as a floating gate 121 for the programming element 102. In one embodiment, the non-volatile memory cell 102 includes a FLASH memory cell 102. In an alternative embodiment, the non-volatile memory cell 102 includes an electrically erasable and programmable read only memory (EEPROM) cell 102.

In FIG. 1A, the second MOSFET 140 and the third MOSFET 150 serve as switching elements, 140 and 150. A channel region in the substrate 111 of the second MOSFET 140 couples a first diffused region 145 to a second diffused region 146. The first diffused region 145 serves as an input node 145 for the second MOSFET 140 and the second diffused region 146 serves as an output node 146 for the second MOSFET 140. The second MOSFET 140 is turned "on" and couples the input node 145 to the output node 146 when the programming element 102 is in a first programmed state. That is, the second MOSFET 140 will conduct an applied signal from input node 145 to the output node 145 when the floating gate 121 of the programming element 102 is in a first programmed state. The second MOSFET 140 is turned "off" and will conduct less current through the second MOSFET 140 between the input node 145 and the output node 146 when the programming element is in a second programmed state. That is, the second MOSFET 140 conducts less of an applied signal from the input node 145 to the output node 146 when the floating gate 121 is in a second programmed state.

A channel region in the n-well 151 of the third MOSFET 150 couples a first diffused region 155 of the third MOSFET 150 to a second diffused region 156 of the third MOSFET 150. The first diffused region 155 serves as an input node 155 for the third MOSFET 150 and the second diffused region 156 serves as an output node 156 for the third MOSFET 150. The second MOSFET 150 is turned "on" and couples the input node 155 to the output node 156 when the programming element 102 is in a second programmed state. The third MOSFET 150 is turned "off" and will conduct less current through the third MOSFET 150 between the input node 155 and the output node 156 when the programming element is in a first programmed state.

A number of input bit lines, 148 and 158, couple to the input nodes, 145 and 155, of the second MOSFET 140 and third MOSFET 150. A number of output bit lines, 149 and 159, couple to the output nodes, 146 and 156, of the second MOSFET 140 and the third MOSFET 150. In one embodiment, the number of output bit lines further couple the output nodes, 146 and 156, for the second and third MOSFET, 140 and 150, to another circuit component, not shown, on an integrated circuit.

Figure 2:
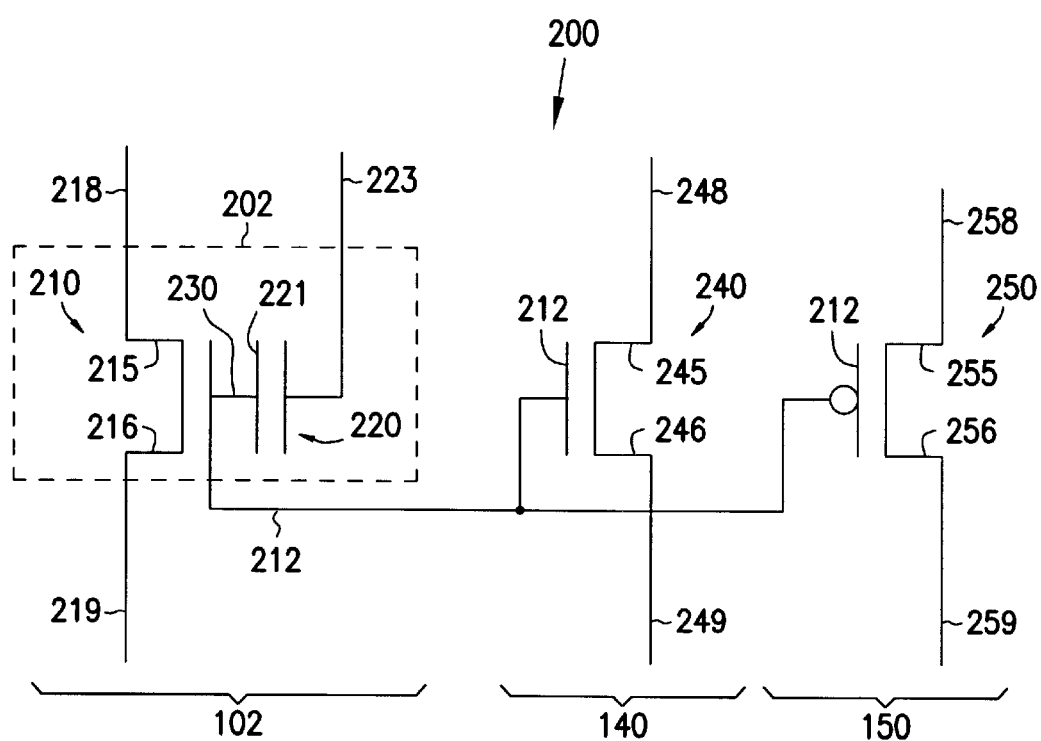
FIG. 2 is a schematic diagram of the non-volatile, reprogrammable switch presented in FIG. 1A.

FIG. 2 is a schematic diagram of a non-volatile, reprogrammable switch 200 as was presented in FIG. 1A. The non-volatile, reprogrammable switch 200 includes non-volatile memory cell, or programming element 202. The programming element 202 includes a first MOSFET 210 with a source region 215 and a drain region 216. The first MOSFET 210 has a gate 212. The gate 212 is coupled to a vertical electrical via, or electrical contact 230 which is included as part of the programming element 202. The programming element further includes a capacitor 220. The capacitor 220 has a bottom plate 221, which serves as a floating gate 221 for the programming element 202, and is coupled by the electrical contact 230 to the gate 212 of the first MOSFET 210. The capacitor has a top plate 223 which serves as a control gate 223 for the programming element 202. A first control line 218 couples to the source region 215 of the first MOSFET 210. A second control line 219 couples to the drain region 216 of the first MOSFET 210. The top plate 223 forms a third control line 223 for the programming element 202.

As shown in FIG. 2, the non-volatile, reprogrammable switch includes a second MOSFET 240 with a source region 240 and a drain region 246. The second MOSFET 240 serves as a switching element 240 for the non-volatile, reprogrammable switch 200. The gate 212 of the first MOSFET 210 also serves as the gate 212 of the second MOSFET 240. The non-volatile, reprogrammable switch includes a third MOSFET 250 with a source region 255 and a drain region 256. The third MOSFET 250 also serves as a switching element 250 for the non-volatile, reprogrammable switch 200. The gate 212 of the first MOSFET 210 also serves as the gate 212 of the third MOSFET. As shown in FIG. 2, the second MOSFET 240 is an n-channel metal oxide semiconductor (NMOS) transistor 240 and the third MOSFET 250 is a p-channel metal oxide semiconductor (PMOS) transistor 250. In an alternative embodiment, the conductivity type of these transistor is reversed, or both may be of the same n-type or p-type conductivity. Also, in an alternative embodiment the third MOSFET 250 is excluded from the non-volatile, reprogrammable switch 200.

A number of input bit lines, 248 and 258, couple to the source regions, or input nodes, 248 and 258, for the second and third MOSFETs, 240 and 250. A number of output bit lines, 249 and 259, couple to the drain regions, or output nodes, 246 and 256 for the second and third MOSFETs, 240 and 250.

The operation of the novel non-volatile, reprogrammable switch of the present invention is explained in reference to FIG. 2. Programming the non-volatile memory cell 202 can be achieved through the use of hot electron injection. By this method, the control gate 223 is brought to a high programming voltage, e.g. 2×Vcc. This forces an inversion region to form in a channel region of the first MOSFET 210. A voltage of approximately half the control gate 223 voltage is placed on the second control line 219 which is coupled to the drain region 216 of the first MOSFET 210. The first control line 218, which is coupled to the source region 215 of the first MOSFET 210 is held at ground. This increases the voltage drop between the source region 215 and the drain region 216 of the first MOSFET 210. In the presence of this voltage drop, the current between the source region 215 and the drain region 216 respectively increases. The resulting high electric field between the source region 215 and the drain region 216 increases the kinetic energy of the electrons. This causes the electrons to gain enough energy to be excited onto and collect on the gate 212. The gate 212 is coupled by the electrical contact 230 to the bottom plate 221 of capacitor 220 in the non-volatile memory cell 202. The electrons are thus trapped on the bottom plate 221, the electrical contact 230, and the gate 212.

After the programming is completed, the negative charge on the gate 212 regulates the conduction through the second and third MOSFETs, 240 and 250, respectively. The presence of a negative charge on the gate 212 of the NMOS transistor 240 raises the threshold voltage (Vt) for the NMOS transistor 240 above the control gate 223 logic "1" voltage. Thus, when a logic "1" voltage is applied to the control gate 223 the NMOS transistor remains "off" and an applied signal to the input node 245 of the NMOS 240 will not conduct through to the output node 246 of the NMOS 240. Conversely, the PMOS transistor will be turned "on." An applied signal to the input node of 255 of the PMOS 250 will conduct through to the output node 256 of the PMOS transistor 250. Even more, the conduction through the PMOS transistor 250 provides a sufficient output voltage signal to the output bit line 259 such that sense amplifiers are not needed to amplify the signal.

The negative charge on the gate 212, the electrical contact 230, and the bottom plate 221, can be erased by grounding the control gate 223 and raising the input bit line 218, which is coupled to the source region 215 of the first MOSFET 210 to a sufficiently high positive voltage to transfer electrons out of the gate 212, the electrical contact 230, and the bottom plate 221, to the source region 215 of the first MOSFET 210. After the erase is completed, the lack of charge on the gate 212, the electrical contact 230, and the bottom plate 221 again regulates the conduction through the second and third MOSFETs, 240 and 250.

In the absence of a stored charge on the gate 212, the threshold voltage (Vt) for the NMOS transistor 240 will be below the control gate 223 logic "1" voltage. When the control gate 223 is raised to a logic "1" voltage the NMOS transistor 230 will be turned "on" and an applied signal to the input node 245 of the NMOS 240 will conduct through to the output node 246 of the NMOS transistor 240. Conversely, the PMOS transistor remain "off." An applied signal to the input node of 255 of the PMOS 250 will not conduct through to the output node 256 of the PMOS transistor 250. The conduction through the NMOS transistor 240 provides a sufficient output voltage signal to the output bit line 249 such that sense amplifiers are not needed to amplify the signal. Thus, an efficient non-volatile, programmable switch is provided according to an optimized DRAM process flow without the need for intervening sense amplifiers. The programmed state of the non-volatile memory cell 202 controls the switching through the NMOS transistor 240 and the PMOS transistor 250.

Figure 3:
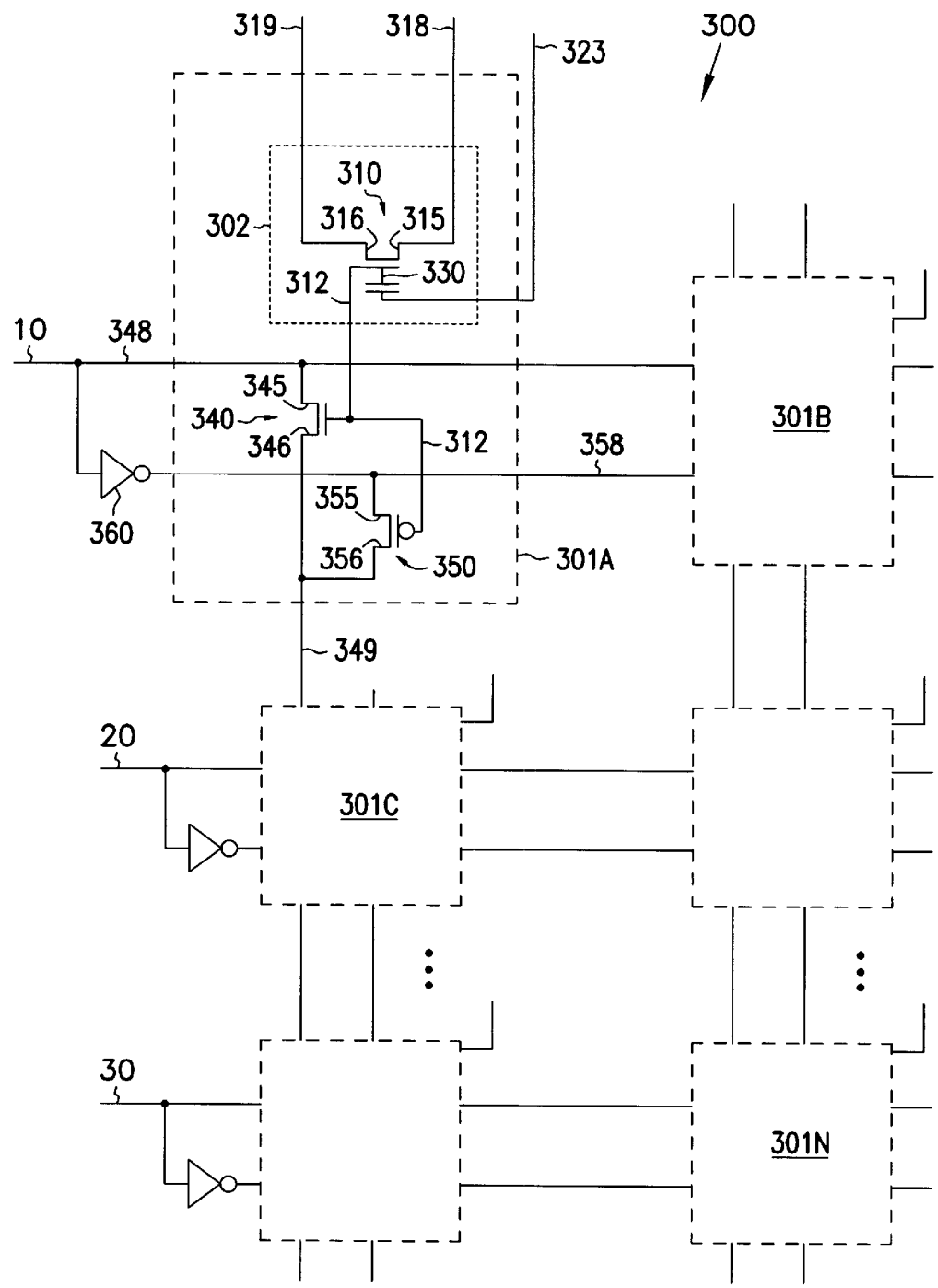
FIG. 3 illustrates a data routing device, address decode tree, or general decoding device according to the teachings of the present invention.

FIG. 3 illustrates that the novel non-volatile, reprogranunable switch can be used as a data routing device 300, address decode tree 300, or general decoding device 300. The data routing device 300 includes a number of non-volatile, reprogrammable switches shown as 301A, 301B, 301C, . . . , 301N. The schematic shown in FIG. 3 illustrates how the number of non-volatile, reprogrammable switches, 301A, 301B, 301C, . . . , 301N, might be used. Any number of non-volatile, reprogrammable switches, 301A, 301B, 301C, . . . , 301N, may be interconnected in any parallel or series arrangement to execute complex switching requirements. Nodes 10, 20, etc., are capable of delivering data to the data routing device 300 from other circuitry of an integrated circuit.

Each non-volatile, reprogrammable switch, 301A, 301B, 301C, ..., 301N, includes the non-volatile, reprogrammable switch structure presented and described in detail above in connection with FIG. 1A. In one embodiment, each non-volatile, reprogrammable switch, 301A, 301B, 301C, ..., 301N, is constructed alike. As shown in detail for non-volatile, reprogrammable switch 301A, a number of programming control lines, 318, 319, and 323, couple to the non-volatile, reprogrammable switch 301A. The number of programming control lines, 318, 319, and 323, are coupled to a non-volatile memory cell 302 portion of the non-volatile, reprogrammable switch 301A. A first control line 318 is coupled to a first diffused region 315 of a first MOSFET 310 of the non-volatile memory cell 302. A second control line 319 is coupled to the second diffused region 316 of the first MOSFET 310. A third control line 323 is integrally formed as the control gate 323 for the non-volatile memory cell 302.

In the embodiment of FIG. 3, each non-volatile, reprogrammable switch, 301A, 301B, 301C, ..., 301N, includes a second MOSFET 340 and a third MOSFET 350. As shown in FIG. 3, the second MOSFET 340 is an n-channel metal oxide semiconductor (NMOS) transistor 340 and the third MOSFET 350 is a p-channel metal oxide semiconductor (PMOS) transistor 350. In an alternative embodiment, the conductivity type of these transistor is reversed, or both may be of the same n-type or p-type conductivity. Also, in an alternative embodiment, one of the second or third MOSFETs, 340 or 350, is excluded from the number of non-volatile, reprogrammable switches, 301A, 301B, 301C, ..., 301N.

Looking at non-volatile, reprogrammable switch 301A, it is shown that node delivers data to a number of input bit lines, 348 and 358. In the embodiment shown in FIG. 3, the input node couples directly to input bit line 348 and couples to input bit line 358 through a buffer 360. Input bit lines 348 and 358 couple to the source regions, or input nodes, 345 and 355, for the second and third MOSFETs, 340 and 350. A number of output bit lines are coupled to the drain regions, or output nodes, 346 and 356, for the second and third MOSFETs, 340 and 350. The operation of the non-volatile, reprogrammable switch 301A is identical the operation presented above. The non-volatile memory cell 302 acts as a programming element 302 for the non-volatile, reprogrammable switch 301A determining whether the second MOSFET 340 is turned "on" or "off" and whether the third MOSFET is turned "on" or "off." In this manner, non-volatile, reprogrammable switch 301A routes an output voltage signal based on whether the programming element 302 is in a first programmed state or a second programmed state. Again, the non-volatile, reprogrammable switch 301A provides a sufficient output voltage signal to other ones of the non-volatile, reprogrammable switches, 301A, 301B, 301C, ..., 301N, or to other circuit components on an integrated circuit, without the need for intervening sense amplifiers.

Figure 4:
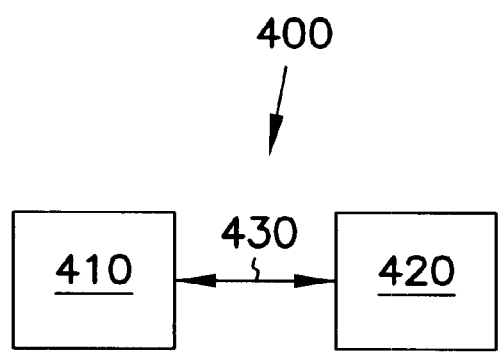
FIG. 4 is a block diagram illustrating an electronic system 400 according to the teachings of the present invention.

FIG. 4 is a block diagram illustrating an electronic system 400 according to the teachings of the present invention. The electronic system 400 includes a processor 410 and a dynamic random access memory (DRAM) chip 420. A system bus 430 couples the processor 410 to the DRAM chip 420. The system bus 430 includes any system bus 430 suitable for transferring data between the processor 410 and the DRAM chip 420. The DRAM chip 420 includes an array of non-volatile, reprogrammable switches, or a data routing device as described in detail in connection with FIGS. 1A, 1B, 2, and 3.

Figure 5:
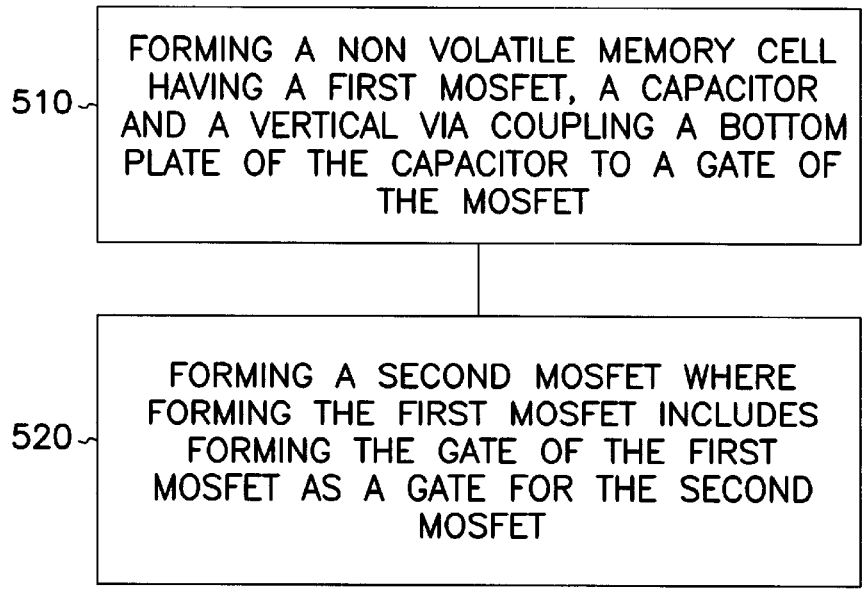
FIG. 5 illustrates, in flow diagram form, a method for forming a non-volatile, reprogrammable switch according to the teachings of the present invention.

FIG. 5 illustrates, in flow diagram form, a method for forming a non-volatile, reprogrammable switch on a DRAM chip according to the teachings of the present invention. The method includes forming a non-volatile memory cell 510. Forming the non-volatile memory cell includes forming a first metal oxide semiconductor field effect transistor (MOSFET) in a semiconductor substrate, forming a capacitor and forming a vertical electrical via such that the vertical electrical via includes coupling a bottom plate of the capacitor through an insulator layer to a gate of first MOSFET. The method further includes forming a second MOSFET in the semiconductor substrate where forming the first MOSFET includes forming the gate of the first MOSFET as a gate for of the second MOSFET 520. In one embodiment, forming the capacitor includes forming a top plate which serves as a control gate for non-volatile memory cell and forming the bottom plate as a floating gate. In one embodiment, forming the capacitor includes forming the bottom plate in a cup shaped having interior walls and exterior walls and which is separated by a capacitor dielectric from a top plate. In this embodiment, forming the capacitor includes forming the capacitor dielectric conformal to the bottom plate, forming the top plate conformal to the capacitor dielectric, wherein a portion of the top plate is located within the interior walls of the bottom plate. In one embodiment, forming the capacitor includes forming a stacked capacitor formed according to a dynamic random access memory (DRAM) process flow. In the method of FIG. 5, forming the second MOSFET includes forming the second MOSFET as a switching element, wherein the switching element is "on" when the floating gate is in a first programmed state, and where the switching element is "off" when the floating gate is in a second programmed state. In one embodiment, forming the non-volatile, reprogrammable switch further includes coupling an output node for the second MOSFET to another circuit component on an integrated circuit.

Figure 6:
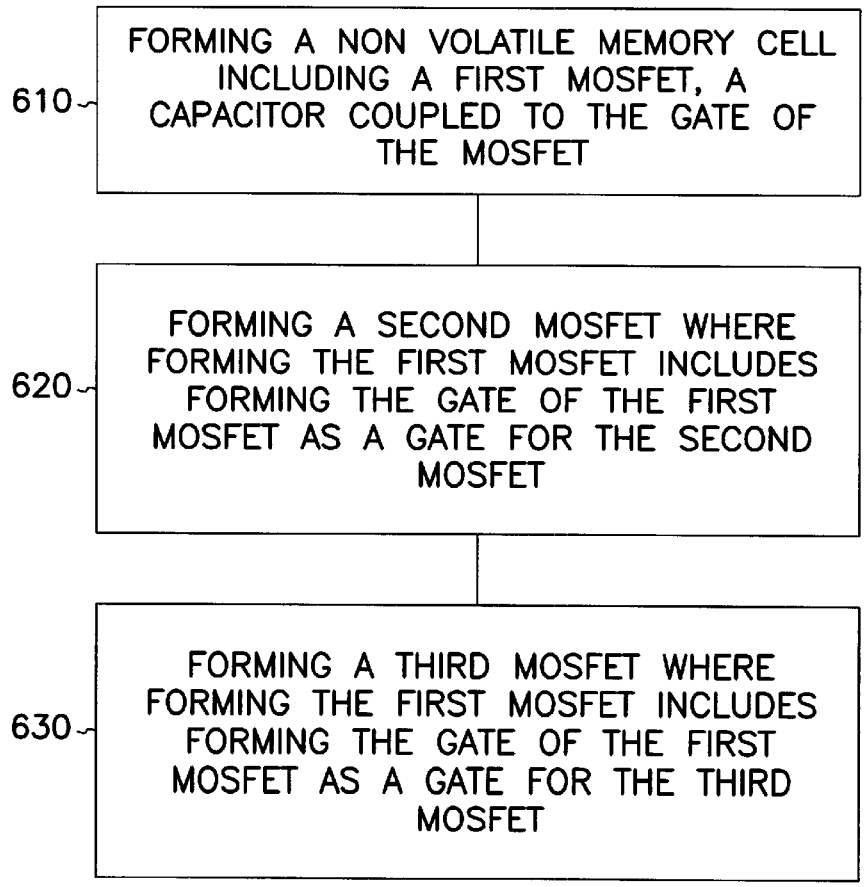
FIG. 6 illustrates, in flow diagram form, another method for forming a non-volatile, reprogrammable switch according to the teachings of the present invention.

FIG. 6 illustrates, in flow diagram form, a method for forming a non-volatile, reprogrammable switch according to the teachings of the present invention. The method includes forming a non-volatile memory cell 610. Forming the non-volatile memory cell includes forming a first metal oxide semiconductor field effect transistor (MOSFET) in a semiconductor substrate, forming a stacked capacitor above a gate of the first MOSFET using a DRAM process, and eclectically coupling a bottom plate of the stacked capacitor to the gate of the first MOSFET. The method includes forming a second MOSFET in the semiconductor substrate, where forming the first MOSFET includes forming the gate of the first MOSFET as a gate for of the second MOSFET 620. The method further includes forming third MOSFET in the semiconductor substrate, where forming the first MOSFET includes forming the gate of the first MOSFET as a gate for the third MOSFET 630. In one embodiment, electrically coupling the bottom plate of the stacked capacitor to the gate of the first MOSFET includes forming a polysilicon plug.

Figure 7:
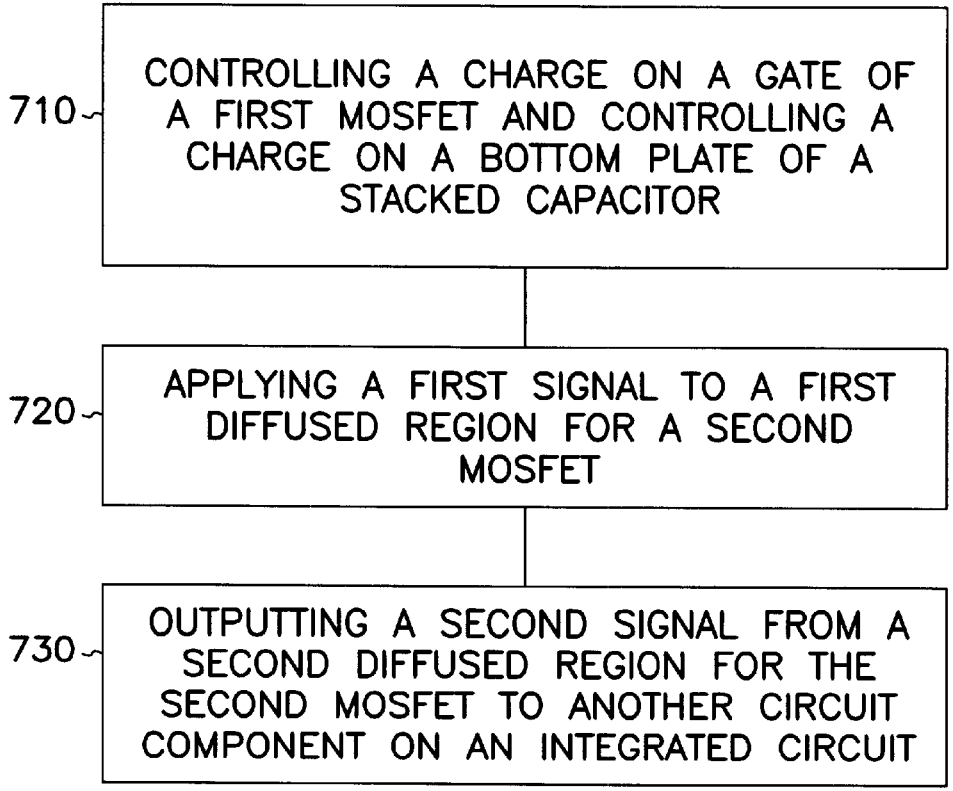
FIG. 7 illustrates, in flow diagram form, a method for operating a non-volatile, reprogrammable switch according to the teachings of the present invention.

FIG. 7 illustrates, in flow diagram form, a method for operating a non-volatile, reprogrammable switch according to the teachings of the present invention. The method includes controlling a charge on a gate of a first metal oxide semiconductor field effect transistor (MOSFET), where controlling the charge on the gate of the first MOSFET includes controlling a charge on a bottom plate of a stacked capacitor 710. The bottom plate of the stacked capacitor is coupled to the gate of the firs MOSFET through an insulator layer, and the gate of the first MOSFET is shared as a gate for a second MOSFET. The method includes applying a first signal to a first diffused region for the second MOSFET 720. The method further includes outputting a second signal from a second diffused region for the second MOSFET to another circuit component on an integrated circuit 730. In one embodiment, controlling a charge on a gate the first MOSFET includes placing a charge on the gate of the first MOSFET using Fowler Nordheim tunneling. In one embodiment of FIG. 7, controlling a charge on the gate of the first MOSFET includes removing a charge from the gate of the first MOSFET and the second MOSFET to a source region for the first MOSFET.

Figure 8:
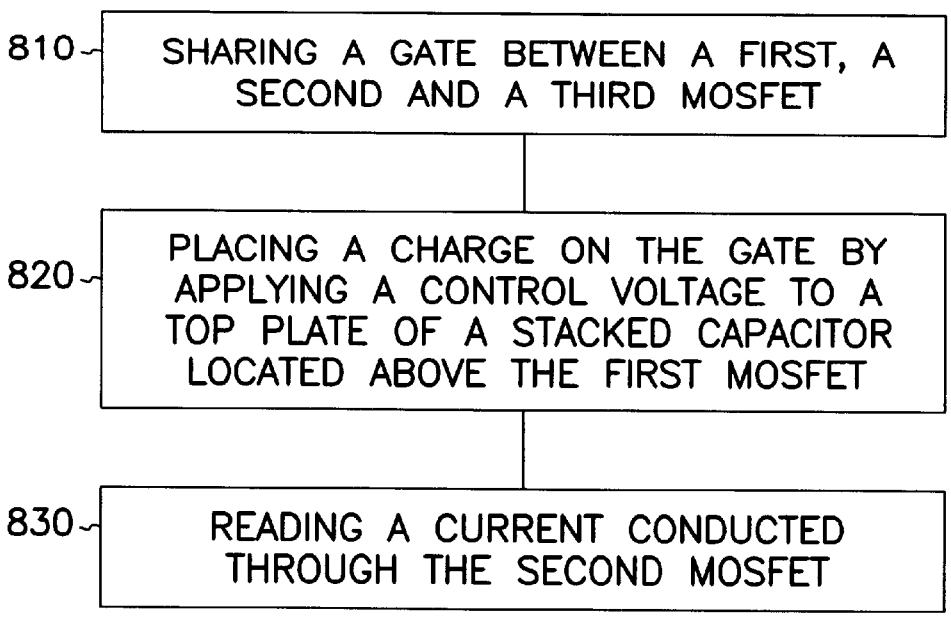
FIG. 8 illustrates, in flow diagram form, another method for operating a switching element according to the teachings of the present invention.

FIG. 8 illustrates, in flow diagram form, a method for operating a switching element. The method includes sharing a gate between a first, a second, and a third MOSFET 810. The method includes placing a charge on the gate such that placing a charge on the gate includes applying a control voltage to a top plate of a stacked capacitor located above the first MOSFET 820. A bottom plate of the stacked capacitor is coupled by a vertical electrical via through an insulator to the gate. The method further includes reading a current conducted through the second MOSFET 830. In one embodiment, placing a charge on the gate includes using channel hot electron (CHE) injection to excite electrons from a channel region of the first MOSFET to the gate. In an alternative embodiment, placing a charge on the gate includes using Fowler Nordheim tunneling to excite electrons from a source region of the first MOSFET to the gate. In one embodiment, the method further includes reading a current conducted through the third MOSFET.

Figure 9:
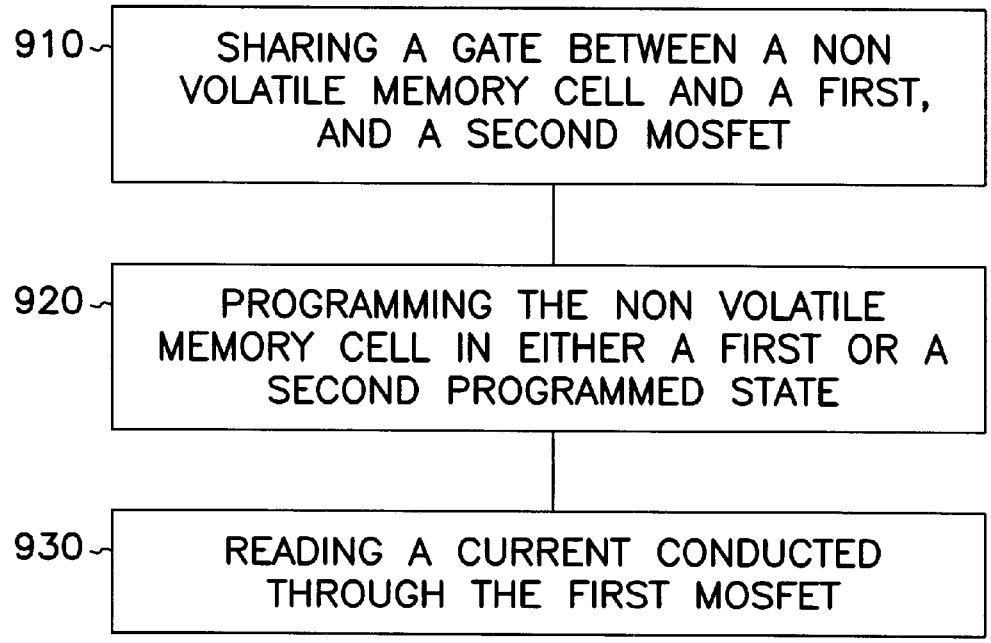
FIG. 9 illustrates, in flow diagram form, a method for operating a switching element according to the teachings of the present invention.

FIG. 9 illustrates, in flow diagram form, a method for operating a switching element according to the teachings of the present invention. The method includes sharing a gate between a non-volatile memory cell and a first, and a second, MOSFET 910. The gate is a floating gate for the non-volatile memory cell. The method further includes programming the non-volatile memory cell in either a first or a second programmed state 920. And, the method includes reading a current conducted through the first MOSFET 930. In one embodiment, the method further includes reading the second MOSFET. In the embodiment of FIG. 9, programming the non-volatile memory cell in either a first or a second programmed state includes turning "on" the first MOSFET and turning "off" the second MOSFET when the non-volatile memory cell in a first programmed state.

Conclusion

Thus, a single or multiple switch elements can be combined with an non-volatile memory cell to create a new, powerful logic cell that is smaller and more robust than conventional circuit solutions. The switches may be either NMOS or PMOS or a combination of both types. The need for intervening sense amps which are normally required to read the status of a non-volatile memory (e.g. an EEPROM cell) and communicate this to additional logic that would then in turn control the status of one or more switches is eliminated. Instead, the switches are controlled directly by a floating gate of the non-volatile memory cell. This eliminates the possibility, which can occur in more conventional designs, that one of the elements controlled by intervening logic could achieve a correct state while another one of the elements could achieve an incorrect state due to an error in either design or manufacturing. The reprogrammability of the non-volatile switching element lends itself to applications such as a very size efficient address decode tree, or other applications such as use in DRAM redundancy schemes. The non-volatile reprogrammable switch of the present invention can be entirely fabricated according to an optimized DRAM process flow.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A non-volatile, reprogrammable switch, comprising:
    a non-volatile memory cell, wherein the non-volatile memory cell includes:
        a first metal oxide semiconductor field effect transistor (MOSFET) formed in a semiconductor substrate;
        a capacitor formed in a subsequent layer above the first MOSFET and separated from the MOSFET by an insulator layer; and
        a vertical electrical via coupling a bottom plate of the capacitor through the insulator layer to a gate of first MOSFET; and
    a second MOSFET formed in the semiconductor substrate, wherein the gate of the first MOSFET also serves as a gate of the second MOSFET.

2. The non-volatile, reprogrammable switch of claim 1, wherein the capacitor includes a stacked capacitor formed according to a dynamic random access memory (DRAM) process flow.

3. The non-volatile, reprogrammable switch of claim 1, wherein the first MOSFET includes an n-channel metal oxide semiconductor (NMOS) transistor.

4. The non-volatile, reprogrammable switch of claim 1, wherein the second MOSFET includes a p-channel metal oxide semiconductor (PMOS) transistor.

5. The non-volatile, reprogrammable switch of claim 1, wherein the second MOSFET includes a channel region separated from the gate by a gate oxide, and wherein the channel region couples a first diffused region and a second diffused region.

6. The non-volatile, reprogrammable switch of claim 1, wherein the first MOSFET includes a channel region separated from the gate by a gate oxide, and wherein the channel region couples a first diffused region to a second diffused region.

7. The non-volatile, reprogrammable switch of claim 1, wherein the capacitor includes a top plate which serves as a control gate for the non-volatile memory cell.

8. A non-volatile, reprogrammable switch, comprising:
    a non-volatile memory cell, wherein the non-volatile memory cell includes:
        a first metal oxide semiconductor field effect transistor (MOSFET) formed in a semiconductor substrate;
        a stacked capacitor formed according to a dynamic random access memory (DRAM) process in a subsequent layer above the MOSFET and separated from the MOSFET by an insulator layer; and
        an electrical contact coupling a bottom plate of the stacked capacitor through the insulator layer to a gate of first MOSFET; and
    a second MOSFET formed in the semiconductor substrate, wherein the gate of the first MOSFET also serves as a gate of the second MOSFET.

9. The non-volatile, reprogrammable switch of claim 8, wherein the first MOSFET serves as a programming element and the second MOSFET serves as a switching element.

10. The non-volatile, reprogrammable switch of claim 9, wherein the stacked capacitor includes a top plate which serves as a control gate for the programming element.

11. The non-volatile, reprogrammable switch of claim 10, wherein the bottom plate of the stacked capacitor is cup shaped having interior walls and exterior walls and is separated by a capacitor dielectric from the top plate.

12. The non-volatile, reprogrammable switch of claim 11, wherein the capacitor dielectric is conformal to the bottom plate, and wherein the top plate is conformal to the capacitor dielectric, a portion of the top plate being located within the interior walls of the bottom plate.

13. The non-volatile, reprogrammable switch of claim 8, wherein the electrical contact includes a polysilicon plug.

14. The non-volatile, reprogrammable switch of claim 8, wherein the non-volatile memory cell includes a FLASH memory cell.

15. A non-volatile, reprogrammable switch, comprising:
a non-volatile memory cell, wherein the non-volatile memory cell includes:
a first metal oxide semiconductor field effect transistor (MOSFET) formed in a semiconductor substrate;
a stacked capacitor formed in a subsequent layer above the first MOSFET and separated from the MOSFET by an insulator layer; and
a vertical electrical via coupling a bottom plate of the capacitor through the insulator layer to a gate of first MOSFET;
a second MOSFET formed in the semiconductor substrate, wherein the gate of the first MOSFET also serves as a gate of the second MOSFET; and
a third MOSFET formed in the semiconductor substrate, wherein the gate of the first and second MOSFET also serves as a gate of the third MOSFET.

16. The non-volatile, reprogrammable switch of claim 15, wherein the second MOSFET includes an n-channel metal oxide semiconductor (NMOS) transistor, and wherein the third MOSFET includes a p-channel metal oxide semiconductor (PMOS) transistor.

17. The non-volatile, reprogrammable switch of claim 15, wherein the second MOSFET includes a channel region separated from the gate by a gate oxide, and wherein the channel region couples a first diffused region and a second diffused region.

18. The non-volatile, reprogrammable switch of claim 17, wherein an input node is coupled to the first diffused region and an output node is coupled to the second diffused region.

19. The non-volatile, reprogrammable switch of claim 18, wherein the non-volatile memory cell serves as a programming element and the second MOSFET serves as a switching element, wherein the second MOSFET couples the input node to the output node when the gate of the second MOSFET is in a first programmed state.

20. The non-volatile, reprogrammable switch of claim 15, wherein the third MOSFET includes a channel region separated from the gate by a gate oxide, and wherein the channel region couples a first diffused region and a second diffused region.

21. The non-volatile, reprogrammable switch of claim 20, wherein an input node is coupled to the first diffused region and an output node is coupled to the second diffused region.

22. The non-volatile, reprogrammable switch of claim 21, wherein the non-volatile memory cell serves as a programming element and the third MOSFET serves as a switching element, wherein the third MOSFET couples the input node to the output node when the gate of the third MOSFET is in a second programmed state.

23. A data decoding device, comprising:
a number of non-volatile, reprogrammable switches, wherein each non-volatile, reprogrammable switch includes:
a non-volatile memory cell, wherein the non-volatile memory cell includes:
a first metal oxide semiconductor field effect transistor (MOSFET) formed in a semiconductor substrate;
a capacitor formed in a subsequent layer above the first MOSFET and separated from the MOSFET by an insulator layer; and
a vertical electrical via coupling a bottom plate of the capacitor through the insulator layer to a gate of first MOSFET; and
a second MOSFET formed in the semiconductor substrate, wherein the gate of the first MOSFET also serves as a gate of the second MOSFET;
a number of programming control lines coupled to the non-volatile memory cells in the number of non-volatile, reprogrammable switches;
a number of input bit lines coupled to an input node for the second MOSFET in the number of non-volatile, reprogrammable switches; and
a number of output bit lines coupled to an output node for the second MOSFET in the number of non-volatile, reprogrammable switches.

24. The data decoding device of claim 23, wherein the capacitor includes a stacked capacitor formed according to a dynamic random access memory (DRAM) process flow.

25. The data decoding device of claim 23, wherein the first MOSFET includes an n-channel metal oxide semiconductor (NMOS) transistor.

26. The data decoding device of claim 23, wherein the second MOSFET includes a p-channel metal oxide semiconductor (PMOS) transistor.

27. The data decoding device of claim 23, wherein the second MOSFET is a switching element and includes a first diffused region coupled to a second diffused region, wherein the first diffused region serves as the input node for the second MOSFET and the second diffused region serves as the output node for the second MOSFET.

28. The data decoding device of claim 23, wherein a first one of the number of control lines couples to a first diffused region for the first MOSFET, a second one of the number of control lines couples to a second diffused region for the first MOSFET, and wherein a third one of the number of control lines couples to a top plate of the capacitor.

29. The data decoding device of claim 28, wherein the non-volatile memory cell is a programming element, wherein the bottom plate of the capacitor is a floating gate.

30. The data decoding device of claim 29, wherein the second MOSFET conducts an applied signal from the input node to the output node when the floating gate is in a first programmed state, and wherein the second MOSFET conducts less of the applied signal from the input node to the output node when the floating gate is in a second programmed state.

31. A data routing device, comprising:
a number of non-volatile, reprogrammable switches, wherein each non-volatile, reprogrammable switch includes:
a non-volatile memory cell, wherein the non-volatile memory cell includes:
a first metal oxide semiconductor field effect transistor (MOSFET) formed in a semiconductor substrate;
a capacitor; and
a vertical electrical via coupling a bottom plate of the capacitor through an insulator layer to a gate of first MOSFET;
a second MOSFET formed in the semiconductor substrate, wherein the gate of the first MOSFET also serves as a gate of the second MOSFET; and a third MOSFET formed in the semiconductor substrate, wherein the gate of the first and second MOSFET also serves as a gate of the third MOSFET;

a number of programming control lines coupled to the non-volatile memory cells in the number of non-volatile, reprogrammable switches;

a number of input bit lines coupled to an input node for the second MOSFET and to an input node for the third MOSFET in the number of non-volatile, reprogrammable switches; and a number of output bit lines coupled to an output node for the second MOSFET and to an output node for the third MOSFET in the number of non-volatile, reprogrammable switches.

32. The data routing device of claim 31, wherein the number of output bit lines further couple the output node for the second MOSFET and the output node for the third MOSFET to the input node for the second MOSFET and the input node for the third MOSFET in the other ones of the number of non-volatile, reprogrammable switches.

33. The data routing device of claim 32, wherein the second MOSFET is turned "on" and the third MOSFET is turned "off" when the floating gate is in a first programmed state, and wherein the second MOSFET is turned "off" and the third MOSFET is turned "on" when the floating gate is in a second programmed state.

34. The data routing device of claim 31, wherein the second MOSFET is an channel metal oxide semiconductor (NMOS) transistor, and the third MOSFET is a p-channel metal oxide semiconductor (PMOS) transistor.

35. The data routing device of claim 34, wherein the non-volatile memory cell is a programming element, and wherein the bottom plate of the capacitor is a floating gate.

36. The data routing device of claim 31, wherein a first one of the number of control lines couples to a first diffused region for the first MOSFET, a second one of the number of control lines couples to a second diffused region for the first MOSFET, and wherein a third one of the number of control lines couples to a top plate of the capacitor.

37. The data routing device of claim 31, wherein the number of non-volatile reprogrammable switches are formed on a dynamic random access memory (DRAM) chip according to a DRAM technology process flow.

38. An electronic system, comprising:

a processor;

a dynamic random access memory (DRAM) chip; and a system bus coupling the processor to the DRAM chip, wherein the DRAM chip includes an array of non-volatile, reprogrammable switches, wherein each non-volatile, reprogrammable switch includes:

a non-volatile memory cell, wherein the non-volatile memory cell includes:

a first metal oxide semiconductor field effect transistor (MOSFET) formed in a semiconductor substrate;

a stacked capacitor; and a vertical electrical via coupling a bottom plate of the stacked capacitor through an insulator layer to a gate of first MOSFET; and a second MOSFET formed in the semiconductor substrate, wherein the gate of the first MOSFET also serves as a gate of the second MOSFET.

39. The electronic system of claim 38, wherein the stacked capacitor includes a top plate which serves as a control gate for the non-volatile memory cell.

40. The electronic system of claim 39, wherein the bottom plate of the stacked capacitor is cup shaped having interior walls and exterior walls and is separated by a capacitor dielectric from the top plate.

41. The electronic system of claim 40, wherein the capacitor dielectric is conformal to the bottom plate, and wherein the top plate is conformal to the capacitor dielectric, a portion of the top plate being located within the interior walls of the bottom plate.

42. The electronic system of claim 38, wherein the vertical electrical via includes a polysilicon plug.

43. The electronic system of claim 38, wherein the non-volatile memory cell includes a FLASH memory cell.

44. The electronic system of claim 38, wherein the stacked capacitor includes a stacked capacitor formed according to a dynamic random access memory (DRAM) process flow.

45. The electronic system of claim 38, wherein first MOSFET includes an n-channel metal oxide semiconductor (NMOS) transistor.

46. The electronic system of claim 38, wherein the second MOSFET includes a p-channel metal oxide semiconductor (PMOS) transistor.

47. The electronic system of claim 38, wherein the second MOSFET is a switching element, wherein the switching element is turned "on" when the non-volatile memory cell is in a first programmed state, and wherein the switching element is turned "off" when the non-volatile memory cell is in a second programmed state.

48. A method for operating a non-volatile, reprogrammable switch, comprising:

controlling a charge on a gate of a first metal oxide semiconductor field effect transistor (MOSFET), wherein controlling the charge on the gate of the first MOSFET includes controlling a charge on a bottom plate of a stacked capacitor, wherein the bottom plate of the stacked capacitor is coupled to the gate of the first MOSFET through an insulator layer, and wherein the gate of the first MOSFET is shared as a gate for a second MOSFET; and applying a first signal to a first diffused region for the second MOSFET; and outputting a second signal from a second diffused region for the second MOSFET to another circuit component on an integrated circuit.

49. The method of claim 48, wherein controlling a charge on a gate the first MOSFET includes placing a charge on the gate of the first MOSFET using Fowler Nordheim tunneling.

50. The method of claim 48, wherein controlling a charge on the gate of the first MOSFET includes removing a charge from the gate of the first MOSFET and the second MOSFET to a source region for the first MOSFET.

51. A method for operating a switching element, comprising:

sharing a gate between a first, a second, and a third MOSFET;

placing a charge on the gate, wherein placing a charge on the gate includes applying a control voltage to a top plate of a stacked capacitor located above the first MOSFET, wherein a bottom plate of the stacked capacitor is coupled by a vertical electrical via through an insulator to the gate; and reading a current conducted through the second MOSFET.

52. The method of claim 51, wherein placing a charge on the gate includes using channel hot electron (CHE) injection to excite electrons from a channel region of the first MOSFET to the gate.

53. The method of claim 51, wherein placing a charge on the gate includes using Fowler Nordheim tunneling to excite electrons from a source region of the first MOSFET to the gate.

54. The method of claim 51, wherein the method further includes reading a current conducted through the third MOSFET.

55. A method for operating a switching element, comprising:

sharing a gate between a non-volatile memory cell and a first, and a second, MOSFET, wherein the gate is a floating gate for the non-volatile memory cell;

programming the non-volatile memory cell in either a first or a second programmed state; and reading a current conducted through the first MOSFET.

56. The method of claim 55, wherein the method further includes reading the second MOSFET.

57. The method of claim 55, wherein programming the non-volatile memory cell in either a first or a second programmed state includes turning "on" the first MOSFET and turning "off" the second MOSFET when the non-volatile memory cell in a first programmed state.

* * * * *

UNITED STATES PATENT AND TRADEMARK OFFICE
CERTIFICATE OF CORRECTION

PATENT NO. : 6,256,225 B1
DATED : July 3, 2001
INVENTOR(S) : Noble et al.

It is certified that error appears in the above-identified patent and that said Letters Patent is hereby corrected as shown below:

Title page,
Item [54], delete "NON-VOLATILE REPROGRAMMABLE" and insert -- NON-VOLATILE, REPROGRAMMABLE --, therefor.

Column 1,
Line 2, delete "NON-VOLATILE REPROGRAMMABLE" and insert -- NON-VOLATILE, REPROGRAMMABLE --, therefor.

Column 4,
Line 4, delete "for of the" and insert -- for the --, therefor.

Column 7,
Line 39, delete "transistor" and insert -- transistors --, therefor.

Column 8,
Line 42, delete "remain" and insert -- remains --, therefor.
Lines 54-55, delete "reprogranunable" and insert -- reprogrammable --, therefor.

Column 9,
Line 42, delete "identical the operation" and insert -- identical to the operation --, therefor.

Column 10,
Line 64, delete "firs" and insert -- first --, therefor.

Column 15, claim 34,
Line 28, delete "an channel" and insert -- n-channel --, therefor.

UNITED STATES PATENT AND TRADEMARK OFFICE
CERTIFICATE OF CORRECTION

PATENT NO.   : 6,256,225 B1
DATED        : July 3, 2001
INVENTOR(S)  : Noble et al.

It is certified that error appears in the above-identified patent and that said Letters Patent is hereby corrected as shown below:

Column 18, claim 57,
Line 10, delete "cell in" and insert -- cell is in --, therefor.

Signed and Sealed this

Eleventh Day of December, 2001

Attest:

NICHOLAS P. GODICI
*Attesting Officer*   *Acting Director of the United States Patent and Trademark Office*